United States Patent
Iacovangelo et al.

(10) Patent No.: US 7,163,749 B2
(45) Date of Patent: Jan. 16, 2007

(54) PROCESS FOR DEPOSITING FINELY DISPERSED ORGANIC-INORGANIC FILMS AND ARTICLES MADE THEREFROM

(75) Inventors: Charles Iacovangelo, Clifton Park, NY (US); Thomas Miebach, Ballston Spa, NY (US); Michael William Mercedes, Watervliet, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/248,150

(22) Filed: Dec. 20, 2002

(65) Prior Publication Data

US 2004/0121167 A1    Jun. 24, 2004

(51) Int. Cl.
    *B32B 27/18*    (2006.01)
(52) U.S. Cl. .................. 428/447; 428/702; 428/913
(58) Field of Classification Search ................ 428/409, 428/411.1, 412, 446, 447, 448, 688, 702, 428/908.8, 913, 323
    See application file for complete search history.

(56) References Cited

U.S. PATENT DOCUMENTS

| | | | |
|---|---|---|---|
| 3,161,615 A | 12/1964 | Goldberg | |
| 3,220,973 A | 11/1965 | Goldberg | |
| 3,312,659 A | 4/1967 | Kurkjy et al. | |
| 3,312,660 A | 4/1967 | Kurkjy et al. | |
| 3,313,777 A | 4/1967 | Elam et al. | |
| 3,666,614 A | 5/1972 | Snedeker et al. | |
| 3,989,672 A | 11/1976 | Vestergaard | |
| 4,194,038 A | 3/1980 | Baker | |
| 4,200,681 A | 4/1980 | Hall | |
| 4,210,699 A | 7/1980 | Schroeter | |
| 4,454,275 A | 6/1984 | Rsenquist | |
| 4,842,941 A | 6/1989 | Devins et al. | |
| 5,463,013 A | 10/1995 | Tokuda et al. | |
| 5,510,448 A | 4/1996 | Fontane | |
| 5,970,751 A * | 10/1999 | Maxon et al. | ................. 65/414 |
| 6,197,282 B1 * | 3/2001 | Oshima et al. | ................ 424/59 |
| 6,261,694 B1 | 7/2001 | Iacovangelo | |
| 6,365,016 B1 | 4/2002 | Iacovangelo et al. | |
| 6,379,757 B1 | 4/2002 | Iacovangelo | |
| 6,397,776 B1 | 6/2002 | Yang et al. | |
| 6,406,683 B1 * | 6/2002 | Drechsler et al. | .............. 424/64 |
| 6,420,032 B1 | 7/2002 | Iacovangelo | |
| 6,426,125 B1 | 7/2002 | Yang et al. | |
| 6,517,687 B1 | 2/2003 | Iacovangelo | |
| 6,582,823 B1 * | 6/2003 | Sakhrani et al. | ............ 428/412 |
| 2004/0025542 A1 * | 2/2004 | Ball et al. | ...................... 65/391 |

FOREIGN PATENT DOCUMENTS

WO    WO 02/24824 A1 *    3/2002

OTHER PUBLICATIONS

U.S. Appl. No. 60/392,486 (Ball et al.).*

* cited by examiner

*Primary Examiner*—Michael J. Feely
(74) *Attorney, Agent, or Firm*—Foley & Lardner LLP

(57) ABSTRACT

A single hybrid organic-inorganic film. The film includes both an organic component, and an inorganic component. The organic component and inorganic component are well interspersed within the film. The film may be incorporated into a multilayer structure including a substrate. A method of forming a hybrid organic-inorganic film. The method includes generating a plasma stream with an expanding thermal plasma generator. The method also includes providing a first reactant and at least one second reactant into the plasma stream extending to a substrate, and forming the hybrid organic-inorganic film on the substrate.

11 Claims, 3 Drawing Sheets

US 7,163,749 B2

PROCESS FOR DEPOSITING FINELY DISPERSED ORGANIC-INORGANIC FILMS AND ARTICLES MADE THEREFROM

BACKGROUND OF INVENTION

This invention is related generally to hybrid organic-inorganic films, products incorporating the hybrid films, and methods for making the films and products.

Products, such as windshields, that incorporate ultraviolet (UV) filters typically benefit from an abrasion resistant coating on the UV filter to protect the filter and windshield from abrasion. The UV filtering and abrasion resistance for such products are typically implemented using an inorganic UV filter and a separate organic abrasion resistant coating. Unfortunately, this approach may suffer from long term weathering failures due to strain occurring at the interface between the inorganic UV filter and the organic adjacent layers or substrate due to differences in stress, coefficient of thermal expansion, hardness and modulus.

In many coating applications where UV filters are coated, the substrate material is a polymer which is typically a material with a substantially lower refractive index (RI) than that of the film or coating used for the UV filter. In this case, interference patterns due to the mismatch in refractive index (RI) between the low RI substrate and the high RI UV filter can be a serious problem, especially in 3D applications.

SUMMARY OF INVENTION

In accordance with one aspect of the present invention, there is provided a single hybrid organic-inorganic film. The film comprises an organic component and an inorganic component, wherein the organic component and inorganic component are well interspersed within the film.

In accordance with another aspect of the present invention, there is provided a multilayer structure. The multilayer structure comprises a substrate and a hybrid organic-inorganic film. The hybrid organic-inorganic film comprises an organic component and an inorganic component, wherein the organic component and inorganic component are well interspersed within the film.

In accordance with another aspect of the present invention, there is provided a method of forming a hybrid organic-inorganic film. The method comprises: generating a plasma; providing a first reactant and at least one second reactant into the plasma extending to a substrate; and forming the hybrid organic-inorganic film on the substrate.

DETAILED DESCRIPTION OF THE PREFERRED EMBODIMENTS

Structure with Hybrid Organic-Inorganic Coating

The preferred embodiments of the invention provide a process that produces a hybrid organic-inorganic film or layer of materials that are mixed as phases or components to provide properties that are not otherwise attainable. The phases are well interspersed. For example, the method provides a single coating for a windshield glazing, or other product glazing, that provides both abrasion resistance and UV protection.

Preferably separate layers are utilized for the abrasion resistance and UV protection functions. For the UV functional layer, some of the organic phase is mixed into the inorganic layers and thereby reduce the stress in the inorganic coating and thereby reduce the strain at the interface between these layers. The hybrid coating also allows for the adjustment of refractive index, which allows the interference patterns in the final product to be reduced (the interference patterns are caused by refractive index differences between substrate and coating).

Figure 1:
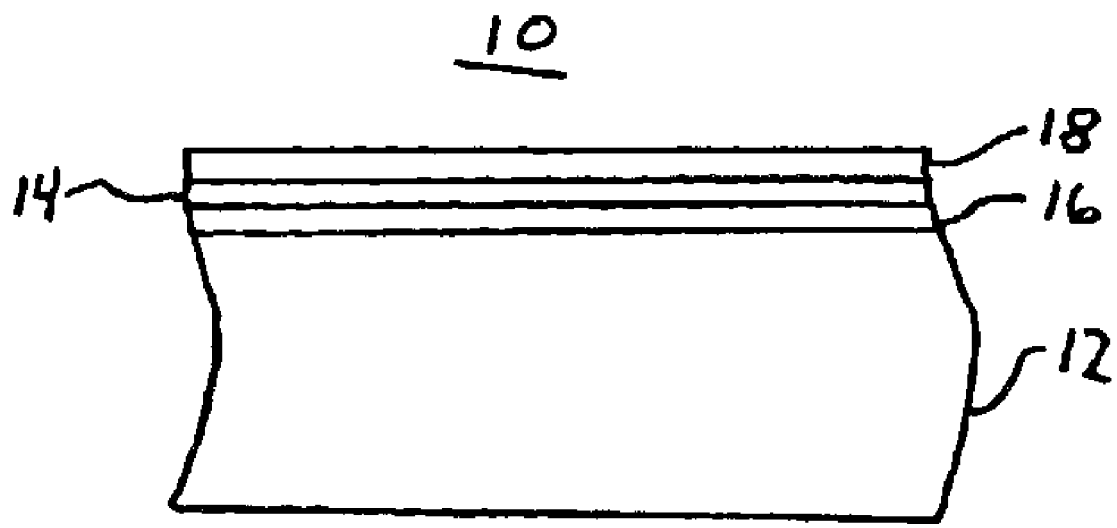
FIG. 1 is a side cross sectional view of a substrate coated with a hybrid organic-inorganic layer according to an exemplary embodiment of the invention.

FIG. 1 illustrates a structure 10 incorporating a hybrid organic-inorganic layer according to one embodiment of the invention. The structure includes a substrate 12 and a hybrid organic-inorganic layer (or film) 14 disposed over the substrate. In this application, "layer" and "film" and "coating" are used interchangeably. The structure 10 may optionally include an interlayer 16 disposed between the substrate 12 and the hybrid organic-inorganic layer 14, depending upon the application. The interlayer 16 may function as an adhesion layer between the substrate 12 and the hybrid organic-inorganic layer 14 to promote adhesion between these layers, or may function to reduce stress between the substrate 12 and overlying layers, including the hybrid organic-inorganic layer 14 or may shield the substrate from photo-oxidation enhanced by titanium oxide which is known to be a photo-oxidative catalyst. The interlayer 16 may comprise sublayers, where one sublayer functions to reduce stress between the substrate 12 and the hybrid organic-inorganic layer 14, and the other sublayer functions to promote adhesion between the substrate 12 and the hybrid organic-inorganic layer 14. The structure 10 may also optionally include an abrasion resistant layer 18 on the hybrid organic-inorganic layer 14 to protect the hybrid organic-inorganic layer 14 from abrasion. Alternatively, the hybrid organic-inorganic layer 14 may have abrasion resistant properties and the separate abrasion resistant layer 18 may be omitted. Other coatings, with functions such as IR reflecting, antireflecting, moisture barrier, electrically conductive, conducting oxide layers, and the like may be disposed between the hybrid organic-inorganic layer 14 and the interlayer 16 or abrasion resistant layer 18, or on top of the abrasion resistant layer 18.

The substrate 12 may comprise, for example, a polymer resin. For example, the substrate may comprise a polycarbonate. Polycarbonates suitable for forming the substrate are well-known in the art.

Aromatic carbonate polymers may be prepared by methods well known in the art as described, for example, in U.S. Pat. Nos. 3,161,615; 3,220,973; 3,312,659; 3,312,660; 3,313,777; 3,666,614; 3,989,672; 4,200,681; 4,842,941; and 4,210,699, all of which are incorporated herein by reference.

The substrate may also comprise a polyestercarbonate which can be prepared by reacting a carbonate precursor, a dihydric phenol, and a dicarboxylic acid or ester forming derivative thereof. Polyestercarbonates are described, for example, in U.S. Pat. Nos. 4,454,275; 5,510,448; 4,194,038; and 5,463,013, all of which are incorporated herein by reference.

The substrate may also comprise a thermoplastic or thermoset material. Examples of suitable thermoplastic materials include polyethylene, polypropylene, polystyrene, polyvinylacetate, polyvinylalcohol, polyvinylacetal, polymethacrylate ester, polyacrylic acids, polyether, polyester, polycarbonate, cellulous resin, polyacrylonitrile, polyamide, polyimide, polyvinylchloride, fluorine containing resins and polysulfone. Examples of suitable thermoset materials include epoxy and urea melamine.

Acrylic polymers, also well known in the art, are another material from which the substrate may be formed. Acrylic polymers can be prepared from monomers such as methyl acrylate, acrylic acid, methacrylic acid, methyl methacrylate, butyl methacrylate, cyclohexyl methacrylate, and the like. Substituted acrylates and methacrylates, such as hydroxyethyl acrylate, hydroxybutyl acrylate, 2-ethylhexylacrylate, and n-butylacrylate may also be used.

Polyesters can also be used to form the substrate. Polyesters are well-known in the art, and may be prepared by the polyesterification of organic polycarboxylic acids (e.g., phthalic acid, hexahydrophthalic acid, adipic acid, maleic acid, terphthalic acid, isophthalic acid, sebacic acid, dodecanedioic acid, and the like) or their anhydrides with organic polyols containing primary or secondary hydroxyl groups (e.g., ethylene glycol, butylene glycol, neopentyl glycol, and cyclohexanedimethanol).

Polyurethanes are another class of materials which can be used to form the substrate. Polyurethanes are well-known in the art, and are prepared by the reaction of a polyisocyanate and a polyol. Examples of useful polyisocyanates include hexamethylene diisocyanate, toluene diisocyanate, MDI, isophorone diisocyanate, and biurets and triisocyanurates of these diisocyanates. Examples of useful polyols include low molecular weight aliphatic polyols, polyester polyols, polyether polyols, fatty alcohols, and the like.

Examples of other materials from which the substrate may be formed include acrylonitrile-butadiene-styrene, glass, VALOX®. (polybutylenephthalate, available from General Electric Co.), XENOY® (a blend of LEXAN® and VALOX®, available from General Electric Co.), and the like. Typically, the substrate comprises a clear polymeric material, such as PC, PPC, PES, PEI or acrylic.

The substrate can be formed in a conventional manner, for example by injection molding, extrusion, cold forming, vacuum forming, blow molding, compression molding, transfer molding, thermal forming, and the like. The article or product formed may be in any shape and need not be a finished article of commerce, that is, it may be sheet material or film which would be cut or sized or mechanically shaped into a finished article. The substrate may be transparent or not transparent. The substrate may be rigid or flexible.

The substrate may be, for example, a vehicle window, such as a car, truck, motorcycle, tractor, boat or air plane window. The substrate may also comprise an eye glass lens, an optical stack, a display screen, such as a television screen, LCD screen, computer monitor screen, a plasma display screen or a glare guard for a computer monitor.

The hybrid organic-inorganic layer or film 14 comprises both an organic component (or phase) and an inorganic component (or phase). The organic component and the inorganic component are interspersed within the single layer or film.

The hybrid organic-inorganic layer 14 may be formed by a variety of plasma enhance chemical vapor deposition (PECVD) techniques known in the art, and is preferably formed by an Expanding Thermal Plasma process (ETP), as discussed in more detail below. ETP processes, such as arc plasma deposition, and systems performing ETP, are generally known, and are described in U.S. Pat. No. 6,420,032, for example, which is herein incorporated by reference in its entirety. The hybrid organic-inorganic layer 14 may have a property associated with the inorganic component of the layer 14, such as UV absorption properties, and additionally properties associated with the organic component of the layer, such as UV absorbance, abrasion resistance, stress relief, and lower RI, for example. The hybrid organic-inorganic layer 14 may also have properties that are not associated with either of the components, but only with the combination of components. These properties are beneficially combined in a single layer, i.e., the hybrid organic-inorganic layer 14.

The interlayer 16, if implemented, may function to relieve stress between the substrate 12 and the overlying layers. Stress may occur, for example, due to different coefficients of thermal expansion, different ductility, and different elastic moduli between the substrate 12 and the overlying layers. Preferably, the interlayer 16 comprises a material which has a value of coefficient of thermal expansion, ductility, and elastic modulus which is between the corresponding values of the substrate and the overlying layers. Preferably the interlayer 16 is chemically resistant to photo induced oxidation by titanium oxide coating. One example of a suitable interlayer material is a plasma polymerized organosilicon, as described in the application Ser. No. 09/271,654, entitled "Multilayer Article and Method of Making by Arc Plasma Deposition", which is herein incorporated by reference in its entirety. Optionally the interlayer 16 may be omitted and the hybrid organic-inorganic layer 14 layer itself may be of a composition to relieve stress between the substrate and itself and the overlying layers. In this regard, the hybrid organic-inorganic layer 14 may have sufficient organic material (or inorganic material for substrates with a similar coefficient of thermal expansion to the inorganic material), for example, to reduce stress. The hybrid organic-inorganic layer 14 layer may be deposited as a single layer or multiple layers sufficiently thick to achieve the desired properties. If more than one layer is utilized, they may all have the same composition or may vary to achieve varying degrees of properties for example UV filtering and/or abrasion resistance.

The abrasion resistant layer 18, if implemented, prevents the hybrid organic-inorganic layer 14 from being scratched during use. The abrasion resistant layer 18 may comprise any scratch or abrasion resistant and UV stable material. The abrasion resistant layer 18 may comprise, for example, a plasma polymerized organosilicon material, as described in U.S. Ser. No. 09/271,654. The organosilicon material may comprise, for example, octamethylcyclotetrasiloxane (D4), tetramethyldisiloxane (TMDSO), hexamethyldisiloxane (HMDSO), or other organosilicon, as described in the above application. The organosilicon monomers are oxidized, decomposed, and polymerized in an arc plasma deposition apparatus, to form an abrasion resistant layer which comprises an oxidized D4, TMDSO, or HMDSO layer, for example. Such an abrasion resistant layer may be referred to as a $SiO_x$ layer. However, the $SiO_x$ layer may also contain hydrogen and carbon atoms in which case it is generally referred to as $SiO_xC_yH_z$. Other examples of compounds and materials suitable as the abrasion-resistant material include silicon dioxide and aluminum oxide, for example. Preferably, however, the abrasion resistant layer 18 is omitted and the hybrid organic-inorganic layer 14 itself has good abrasion-resistant properties.

Deposition System

Figure 2:
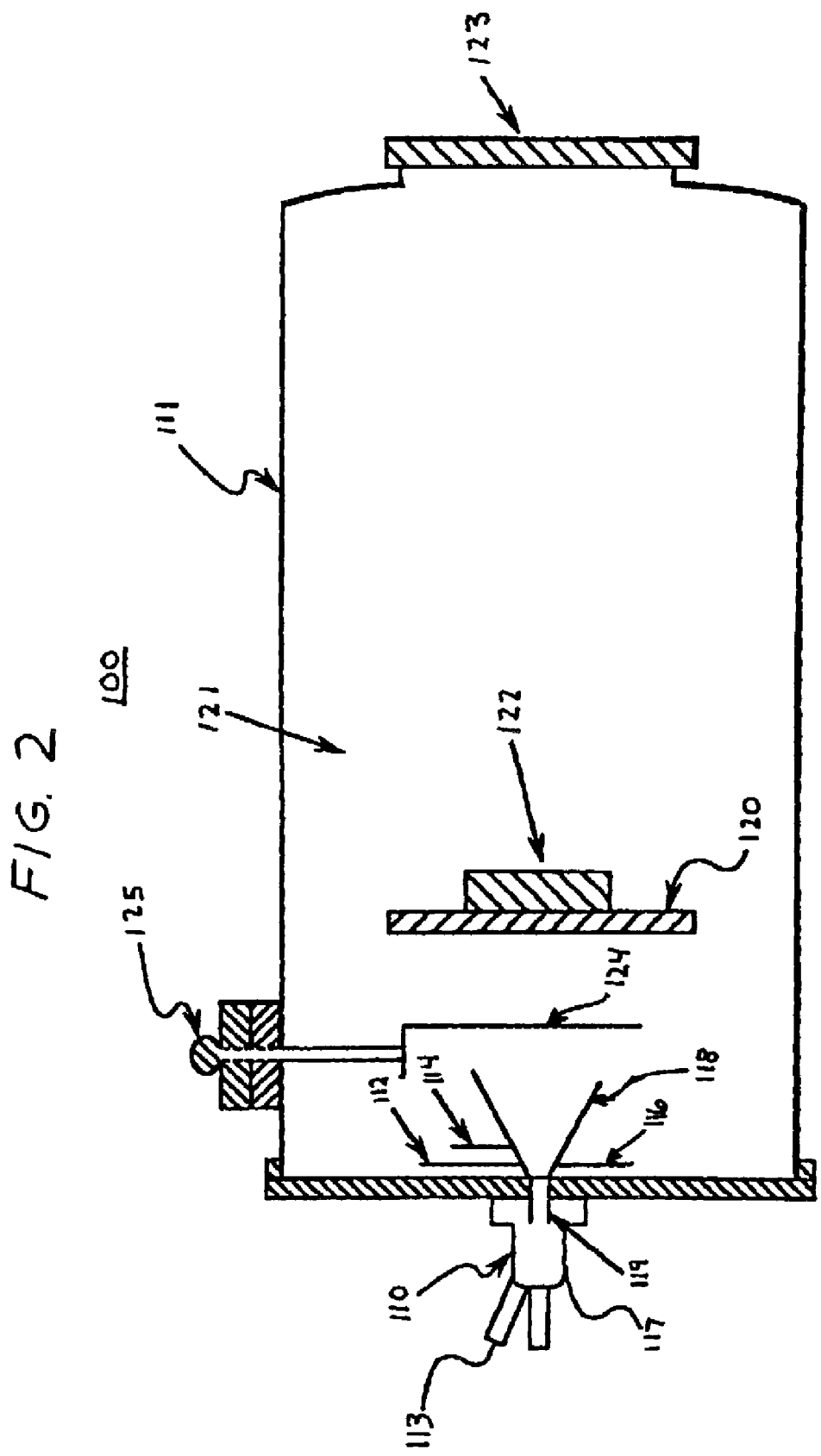
FIG. 2 is a side cross sectional view of an apparatus used to manufacture the substrate coated with a hybrid organic-inorganic layer according to an exemplary embodiment of the invention.

The system for forming the hybrid organic-inorganic layer 14 is preferably an ETP system such as described in U.S. Pat. No. 6,420,032. FIG. 2 illustrates an example of an appropriate system 100 for forming a hybrid organic-inorganic layer 14 according to embodiments of the invention. The system of FIG. 2 is similar to the system of FIG. 4 of U.S. Pat. No. 6,420,032. Other appropriate ETP systems are disclosed for example in U.S. Pat. No. 6,397,776, entitled "APPARATUS FOR LARGE AREA CHEMICAL VAPOR DEPOSITION USING MULTIPLE EXPANDING THERMAL PLASMA GENERATORS", and U.S. patent application Ser. Nos. 09/683,148, 09/683,149 and 10/064,888, all of which are hereby incorporated by reference in their entirety. These latter disclosures illustrate features such as multiple injection rings, one ring around several arcs, and/or an adjustable cathode to anode distance, which may be preferable in some applications.

The system 100 comprises a plasma generation chamber 110 and a deposition chamber 111. The deposition chamber 111 contains a substrate 120 mounted on a temperature controlled support 122. The substrate 120 may be a transparent glass or polymeric substrate 12, for example, coated with the interlayer 16, if implemented, as shown in FIG. 1. The deposition chamber 111 also contains a door (not shown) for loading and unloading the substrate 120 and an outlet 123 for connecting to a pump. The support 122 may be positioned at any position in volume 121 of deposition chamber 111. The substrate 120 may be positioned 10 to 50 cm, for example, and typically about 25.5 cm, from the anode 119 of the plasma generator.

The deposition chamber 111 also optionally comprises a retractable shutter 124. The shutter 124 may be positioned, for example, by a handle 125 or by a computer controlled positioning mechanism. The shutter 124 may also contain a circular aperture to control the diameter of the plasma that emanates from the plasma generation chamber 110 towards the substrate 120. The deposition chamber 111 may also optionally comprise magnets or magnetic field generating coils (not shown) adjacent to chamber walls to direct the flow of the plasma.

The deposition chamber 111 may also contain an optional nozzle 118. The nozzle 118 provides improved control of the injection, ionization and reaction of the reactants to be deposited on the substrate 120. The nozzle 118 provides for the deposition of a material such as the hybrid organic-inorganic layer on the substrate 120 and minimizes or even prevents formation of powdery reactant deposits on the substrate 120. Preferably, the nozzle 118, if employed, has a conical shape with a divergent angle of about 40 degrees and a length of about 10 to 80 cm, preferably about 16 cm. However, the nozzle 118 may alternatively have a variable cross section, such as such as conical-cylindrical-conical or conical-cylindrical. Furthermore, the nozzle 118 may have a divergent angle other than 40 degrees and a length other than 16 cm. The nozzle may also be omitted entirely.

The deposition chamber 111 also contains at least one reactant supply line. For example, the deposition chamber 111 may contain a first reactant supply line 112, a second reactant supply line 114, and a third reactant supply line 116 to deposit the hybrid organic-inorganic layer on the substrate 120. The supply lines 112, 114 and 116 preferably communicate with the nozzle 118 and supply reactants into the plasma flowing through the nozzle. The deposition chamber 111 also generally contains vacuum pumps (not shown) for evacuating the chamber 111.

The plasma generation chamber 110 contains at least one cathode 113, a plasma gas supply line 117 and an anode 119. The plasma generation chamber 110 typically comprises three cathodes 113. The cathodes 113 may comprise, for example, tungsten or thorium doped tungsten tips.

The plasma generation chamber 110 generally includes at least one plasma gas supply line 117. The plasma generation chamber 110 may also contain a purging gas supply line adjacent to the carrier gas supply line 117 to supply a purging gas to chambers 110 and 111 prior to supplying the plasma gas.

To form a plasma in the plasma generation chamber 110, a plasma gas is supplied through plasma gas supply line 117. The plasma gas may suitably comprise a noble gas, such as argon or helium, or a reactive gas, such as nitrogen, ammonia, carbon dioxide or hydrogen or any mixture thereof. If there is more than one plasma gas, then the plural gasses may be supplied through plural supply lines, if desired. Preferably, for the hybrid organic-inorganic layer deposition, the plasma gas comprises argon. The plasma gas in plasma generation chamber 110 is maintained at a higher pressure than the pressure in the deposition chamber 111, which is continuously evacuated by a pump. An arc voltage is then applied between the cathode(s) 113 and the anode 119 to generate a plasma in the plasma generation chamber 110. The plasma then extends through the aperture of the anode 119 into the deposition chamber 111 due to the pressure difference between chambers 110 and 111. The reactants are supplied into the plasma through supply lines 112, 114 and 116.

Methods of Forming the Hybrid Organic-Inorganic Layer

A method of forming hybrid organic-inorganic layers according to an embodiment of the present invention is now described. The hybrid organic-inorganic layers were formed by ETP deposition onto polycarbonate substrates. The hybrid organic-inorganic layers comprise an organic component formed from octamethylcyclotetrasiloxane (D4) and an inorganic component of $TiO_2$. The organic component formed from D4 is referred to in this application as the D4 organic component. The D4 organic component may be SiOx, but may also contain hydrogen and carbon atoms in which case it is generally referred to as $SiO_xC_yH_z$.

An Ar expanding thermal plasma (ETP) was generated. A first and at least one second reactant are then supplied to the plasma via supply lines. The first reactant as the source of titanium may be any volatile oxidizable Ti containing precursor. Preferably Ti-alkoxides (e.g., isopropoxide) may be used. The at least one second reactant may include water or oxygen or other organotitanate. Preferably the first reactant comprises $TiCl_4$ and the at least second reactant comprises water vapor and D4. The first and at least one second reactants react and form a hybrid organic-inorganic film on the substrate. Specifically, the Ar expanding thermal plasma (ETP) was used to simultaneously plasma oxidize $TiCl_4$ to form a titanium oxide, such as $TiO_2$ or non-stoichiometric $TiO_x$, inorganic component and plasma polymerize and oxidize octamethylcyclotetrasiloxane (D4) to form the D4 organic component. The water was fed to the ETP as an oxidant.

D4, $TiCl_4$ and water vapor were supplied as reactant gases as follows. A series of samples were formed with hybrid organic-inorganic layers or coatings having a progressively increasing volume percent of D4 organic component in the hybrid coating. The hybrid organic-inorganic coating had progressively a volume percent ranging from 25–75% D4 organic component. The increasing amount of D4 organic component was implemented by appropriately adjusting the flow rates of D4 and $TiCl_4$, with an increase in D4 flow rate producing a greater volume percent of D4 organic component. Table 1 lists the deposition parameters for the hybrid organic-inorganic layer of $TiO_2$ and D4 organic components.

TABLE 1

| Ex. | TiCl$_4$ lpm | D4 lpm | Ar lpm | H$_2$O lpm | A | Thickness (nm) | D4 Vol. % | Stress (psi) | RI at 580 nm |
|---|---|---|---|---|---|---|---|---|---|
| 1 | 0.2 | 0 | 3 | 0.8 | 1.1 | 230 | 0 | 95000 | 2.3 |
| 2 | 0.2 | 0 | | | 1.22 | | | | |
| 3 | 0.2 | 0.8 | | | 1.23 | | | | |
| 4 | 0.2 | .01 | 3 | 0.8 | 1.1 | 316 | 25 | | 2.08 |
| 5 | 0.2 | 0.016 | | | 1.19 | | | | |
| 6 | 0.2 | 0.025 | | | 0.91 | | | | |
| 7 | 0.2 | .03 | 3 | 0.8 | 0.79 | 590 | 75 | | 1.66 |
| 8 | 0.6 | 0 | 5 | 2.4 | 1.53 | 360 | 0 | 44819 | 2.3 |
| 9 | 0.6 | .03 | 5 | 2.4 | 1.19 | 925 | 43 | −4176 | 1.93 |
| 10 | 0.6 | .06 | 5 | 2.4 | 1.12 | 1002 | 58 | −5198 | 1.81 |
| 11 | 0.6 | .10 | 5 | 2.4 | 0.89 | 1337 | 69 | −3465 | 1.71 |
| 12 | 1 | 0 | 5 | 4 | 2.3 | 533 | 0 | 29326 | 2.3 |
| 13 | 1 | .03 | 5 | 4 | 1.84 | 1358 | 34 | 3233 | 2.01 |
| 14 | 1 | .06 | 5 | 4 | 1.82 | 1342 | 48 | −1376 | 1.89 |
| 15 | 1 | .10 | 5 | 4 | 1.68 | 1547 | 54 | −2136 | 1.81 |

All examples in Table 1 were performed at a current of 80 Amps and a voltage of 30 V. All the examples in Table 1 were coated at 45 mT (milliTorr), preheating the substrate to ~120° C., at a scan rate of 2.3 cm/s for a coating time of ~7 seconds. The volume % of the D4 organic component in the coating was determined from ellipsometry and is listed in Table 1. The absorbency (A) was measured at 330 nm. The stress was calculated from the bowing of a Si wafer using an Ionic Systems stress gauge SGII. The Argon (Ar), water (H$_2$O), TiCl$_4$, and D4 flow rates are listed in table 1. The stress (in psi), refractive index, film thickness and absorbency are also listed.

The coatings from table 1 were well adhered and clear. The as-deposited coatings were subjected to a water immersion test as follows. The water immersion test consisted of submerging the hybrid organic-inorganic coating, formed on the substrate for 3 days in distilled water at 65° C. All of the hybrid organic-inorganic coatings listed in Table 1 passed the water immersion test showing no loss of absorbency after immersion for 3 days in distilled water at 65° C.

A significant property of the progressive coatings listed in Table 1 is that the behavior of the refractive index (RI) and extinction coefficient (measured as the absorbency at 330 nm) as a function of the D4 organic component volume percent was not the same. The RI increased linearly with the volume percent of TiO$_2$, and essentially followed the following formula: RI=(RI$_{D4}$×(volume percent D4 organic component))+(RI$_{TiO2}$×(volume percent TiO$_2$)), where RI$_{D4}$ is the RI of a pure D4 organic component film, and RI$_{TiO2}$ is the RI of a pure TiO$_2$ film.

On the other hand, the absorbency of the hybrid organic-inorganic coatings was equal to that of a pure TiO$_2$ film up to about 30 volume % D4 organic component. Even at about 75% D4, the absorbency of the hybrid coating was ⅔ that of a pure TiO$_2$ film. Furthermore, as shown in Table 1 the stress (the intrinsic stress) of the coating can be tailored from highly tensile to compressive allowing matching of layers in a multi-layer stack. The zero stress state occurs at ~35% organic coating.

Because the extinction coefficient remains that of a pure TiO$_2$ film up to about 25 volume % D4 organic component, and does not drop off significantly up to about 75% D4 organic component, a hybrid coating can be made which is a significantly more ductile coating than a pure TiO$_2$ film and does not have a significant interference fringes problem due to a large mismatch of the coating RI with the polycarbonate substrate. At the same time the hybrid coating still provides substantial filtering of UV.

Thus, the series of samples with progressively increasing volume % of organic component provides an example of a film with a property associated with one of the organic component and inorganic component, where that property remains substantially constant over a range of volume percents of respective organic and inorganic components. In this case the property is the UV absorbency associated with the inorganic component. The stress was non-linear with the volume %.

The series of samples with progressively increasing volume % of organic component also provides an example of a film with a property associated with one of the organic component and inorganic component, where that property changes linearly with the volume percent of the respective organic and inorganic components over a range of volume percents. In this case the property is the RI where the RI changes linearly with the volume percent of the inorganic component over the range of volume percents.

Figure 3:
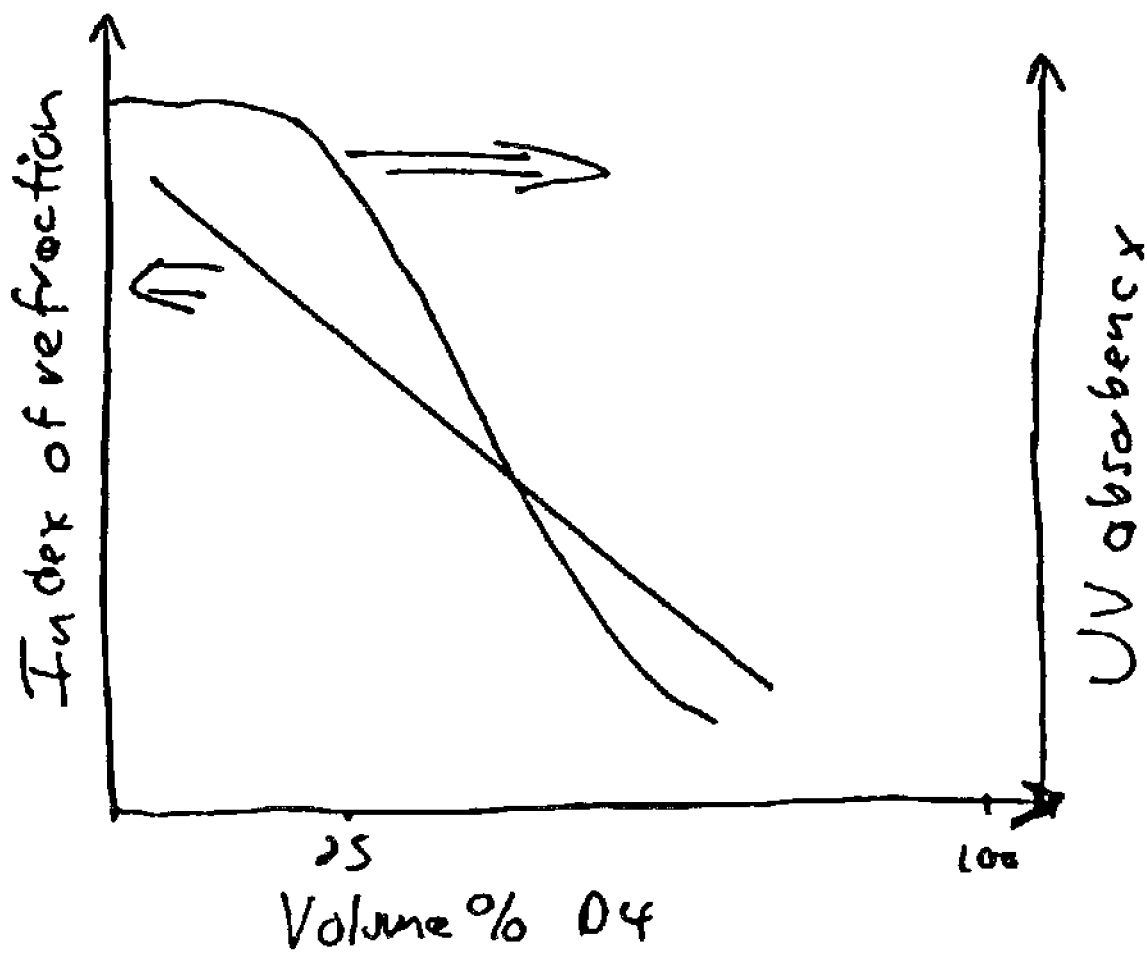
FIG. 3 is a graph illustration of the behavior of the UV absorbency and the index of refraction of the hybrid organic-inorganic layer as a function of the volume % of the D4 organic component.

FIG. 3 is a graph qualitatively illustrating the behavior of the UV absorbency and the index of refraction of the hybrid organic-inorganic layer as a function of the volume % of the D4 organic component. As can be seen the index of refraction changes linearly with the volume % of the D4 organic component, while the UV absorbency remains relatively constant up to about 25% D4.

One advantage of using ETP is that deposition is extremely fast so phases or components do not have time to settle out and segregate as they do in other film formation techniques, such as the sol-gel approach. Thus, ETP allows for the intimate mixing of organic and inorganic phases interspersed in a single film. Because a hybrid film can be formed, properties otherwise unattainable can now be obtained. The above description describes a particular hybrid coating with TiO$_2$ and D4 organic component components. However, other hybrid films or coatings can be deposited using ETP.

While the invention has been described in detail and with reference to specific embodiments thereof, it will be apparent to one skilled in the art that various changes and modifications can be made therein without departing from the spirit and scope of the invention. Thus, the breadth and scope of the present invention should not be limited by any of the above-described exemplary embodiments, but should be defined only in accordance with the following claims and their equivalents.

The invention claimed is:

1. A hybrid organic-inorganic film comprising an organic component and an inorganic component, the film formed by the process of:
   generating a plasma stream with an expanding thermal plasma generator;
   providing a first reactant comprising $TiCl_4$ and at least one second reactant comprising water vapor and octamethylcyclotetrasiloxane (D4) into the plasma stream extending to a substrate;
   forming the hybrid organic-inorganic film on the substrate.

2. The hybrid organic-inorganic film of claim 1, wherein the plasma comprises an Ar plasma.

3. The hybrid organic-inorganic film of claim 1, wherein the process further comprises:
   supplying the first reactant into the plasma at a rate of between 0.1 and 10 lpm, and the at least one second reactant into the plasma at a rate of 0.1 to 1 lpm.

4. The hybrid organic-inorganic film of claim 3, wherein the process further comprises:
   supplying the first reactant into the plasma at a rate of between 0.2 and 2 lpm, and the at least one second reactant into the plasma at a rate of 0.01 to 0.2 lpm.

5. The hybrid organic-inorganic film of claim 1, wherein the film comprises between 10% and 90% organic component by volume.

6. The hybrid organic-inorganic film of claim 1, wherein the organic component comprises an abrasion resistant material and the inorganic component comprises an ultraviolet (UV) filter material.

7. The hybrid organic-inorganic film of claim 1, wherein a first property is associated with the organic component and a second property is associated with the inorganic component, and one of the first and second properties remains substantially constant over a range of volume percents of respective organic and inorganic components.

8. The hybrid organic-inorganic film of claim 7, wherein the second property is UV absorbency and the UV absorbency remains substantially constant over the range of volume percents of the inorganic component.

9. The hybrid organic-inorganic film of claim 1, wherein a first property is associated with the organic component and a second property is associated with the inorganic component, and one of the first and second properties changes linearly with the volume percent of the respective organic and inorganic components over a range of volume percents.

10. The hybrid organic-inorganic film of claim 9, wherein the first property is refractive index (RI) and the RI changes linearly with the volume percent of the inorganic component over the range of volume percents.

11. The hybrid organic-inorganic film of claim 9, wherein the first property is a stress of the film and the stress changes linearly with the volume percent of the inorganic component over the range of volume percents.

* * * * *